US012813068B2

(12) United States Patent
Lee et al.

(10) Patent No.: US 12,813,068 B2
(45) Date of Patent: Nov. 24, 2026

(54) LIGHT-EMITTING DIODE AND DISPLAY APPARATUS INCLUDING THE SAME

(71) Applicant: Samsung Display Co., Ltd., Yongin-si (KR)

(72) Inventors: Bora Lee, Yongin-si (KR); Hyunbin Park, Yongin-si (KR); Byeongwook Yoo, Yongin-si (KR); Jinyoung Yun, Yongin-si (KR); Sohee Jo, Yongin-si (KR); Illhun Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 120 days.

(21) Appl. No.: 18/899,801

(22) Filed: Sep. 27, 2024

(65) Prior Publication Data

US 2025/0234702 A1 Jul. 17, 2025

(30) Foreign Application Priority Data

Jan. 17, 2024 (KR) ........................ 10-2024-0007643

(51) Int. Cl.
*H10K 50/852* (2023.01)
*H10K 50/856* (2023.01)
*H10K 102/00* (2023.01)

(52) U.S. Cl.
CPC ......... *H10K 50/852* (2023.02); *H10K 50/856* (2023.02); *H10K 2102/351* (2023.02)

(58) Field of Classification Search
CPC ............... H10K 50/852; H10K 50/856; H10K 2102/351
See application file for complete search history.

(56) References Cited

U.S. PATENT DOCUMENTS

| | | | | |
|---|---|---|---|---|
| 10,818,854 | B2 | 10/2020 | Park et al. | |
| 11,139,442 | B2 | 10/2021 | Fusella et al. | |
| 11,437,604 | B2 | 9/2022 | Kim et al. | |
| 11,569,480 | B2 | 1/2023 | Fusella et al. | |
| 11,895,861 | B2 | 2/2024 | Kim et al. | |
| 2017/0271624 | A1 * | 9/2017 | Hua | H10K 59/879 |
| 2023/0292542 | A1 | 9/2023 | Park et al. | |

FOREIGN PATENT DOCUMENTS

| | | | |
|---|---|---|---|
| JP | 7004614 | B2 | 1/2022 |
| KR | 10-2021-0005364 | A | 1/2021 |
| KR | 10-2021-0156371 | A | 12/2021 |
| KR | 10-2391617 | B1 | 4/2022 |
| KR | 10-2023-0044299 | A | 4/2023 |

OTHER PUBLICATIONS

Fusella et al.; Plasmonic enhancement of stability and brightness in organic light-emitting devices; Nature, vol. 585, 379-382 (2020).

* cited by examiner

*Primary Examiner* — Anne M Hines
(74) *Attorney, Agent, or Firm* — Womble Bond Dickinson (US) LLP

(57) ABSTRACT

A display apparatus includes a substrate, a pixel electrode above the substrate, an opposite electrode above the pixel electrode, and having a thickness between about 150 Å and about 350 Å, an emission layer between the pixel electrode and the opposite electrode, a first functional layer between the pixel electrode and the emission layer, and a second functional layer between the emission layer and the opposite electrode, and having a thickness between about 100 Å and about 400 Å.

18 Claims, 10 Drawing Sheets

LIGHT-EMITTING DIODE AND DISPLAY APPARATUS INCLUDING THE SAME

CROSS-REFERENCE TO RELATED APPLICATION

The present application claims priority to, and the benefit of, Korean Patent Application No. 10-2024-0007643, filed on Jan. 17, 2024, in the Korean Intellectual Property Office, the entire disclosure of which is incorporated herein by reference.

BACKGROUND

1. Field

One or more embodiments relate to a light-emitting diode having an effectively extended lifespan and a display apparatus including the light-emitting diode.

2. Description of the Related Art

Among display apparatuses, organic light-emitting display apparatuses have attracted attention as next-generation display apparatuses because they have the aspects of a wide viewing angle, excellent contrast, and fast response speed.

As an display element, organic light-emitting display apparatuses include organic light-emitting diodes (OLEDs) each including a hole injection electrode, an electron injection electrode, and an organic emission layer formed therebetween. Organic light-emitting display apparatuses are self-emissive display apparatuses that generate light as excitons, which are generated by combining, in the organic emission layer, holes injected from the hole injection electrode with electrons injected from the electron injection electrode, transition from an excited state to a ground state.

Organic light-emitting display apparatuses, which are self-emissive display apparatuses, do not require a separate light source, and thus may be driven at low voltage and may be configured in a lightweight and thin form. In addition, organic light-emitting display apparatuses have suitable viewing angle, contrast, response speed, etc., and thus, the application range of the organic light-emitting display apparatuses has expanded from personal portable devices, such as mobile phones, to televisions (TVs).

SUMMARY

One or more embodiments include a light-emitting diode having an effectively extended lifespan and a display apparatus including the light-emitting diode. Embodiments set forth herein are examples, and embodiments of the disclosure are not limited thereto.

Additional aspects will be set forth in part in the description that follows and, in part, will be apparent from the description, or may be learned by practice of the presented embodiments of the disclosure.

According to one or more embodiments, a display apparatus includes a substrate, a pixel electrode above the substrate, an opposite electrode above the pixel electrode, and having a thickness between about 150 Å and about 350 Å, an emission layer between the pixel electrode and the opposite electrode, a first functional layer between the pixel electrode and the emission layer, and a second functional layer between the emission layer and the opposite electrode, and having a thickness between about 100 Å and about 400 Å.

The second functional layer may include an electron transport layer having a thickness between about 100 Å and about 310 Å.

The second functional layer may have a refractive index between about 2.0 and about 3.0.

The display apparatus may further include a capping layer above the opposite electrode.

The capping layer may have a refractive index between about 2.3 and about 3.0.

The display apparatus may further include a first optical functional layer above the opposite electrode, and having an uneven surface.

The display apparatus may further include a second optical functional layer between the second functional layer and the opposite electrode, and having an uneven surface.

A thickness of the first optical functional layer may be greater than a thickness of the second optical functional layer.

The emission layer may be configured to emit blue light, wherein a distance between the pixel electrode and the emission layer is between about 800 Å and about 1,500 Å.

The emission layer may be configured to emit green light, wherein a distance between the pixel electrode and the emission layer is between about 1,200 Å and about 2,000 Å.

The emission layer may be configured to emit red light, wherein a distance between the pixel electrode and the emission layer is between about 1,800 Å and about 2,500 Å.

The pixel electrode may include a reflective electrode, wherein the opposite electrode includes a light-transmitting electrode.

According to one or more embodiments, a display apparatus includes a substrate, a pixel electrode above the substrate, an opposite electrode above the pixel electrode and having a thickness between about 150 Å and about 350 Å, an emission layer between the pixel electrode and the opposite electrode, a first functional layer between the pixel electrode and the emission layer, and a second functional layer between the emission layer and the opposite electrode and having a refractive index between about 2.0 and about 3.0.

The display apparatus may further include a capping layer above the opposite electrode.

The capping layer may have a refractive index between about 2.3 and about 3.0.

The display apparatus may further include a first optical functional layer above the opposite electrode, and having an uneven surface.

The display apparatus may further include a second optical functional layer between the second functional layer and the opposite electrode, and having an uneven surface.

A thickness of the first optical functional layer may be greater than a thickness of the second optical functional layer.

According to one or more embodiments, a light-emitting diode includes a pixel electrode, an opposite electrode above the pixel electrode, and having a thickness between about 150 Å and about 350 Å, an emission layer between the pixel electrode and the opposite electrode, a first functional layer between the pixel electrode and the emission layer, and a second functional layer between the emission layer and the opposite electrode, and having a thickness between about 100 Å and about 400 Å.

The second functional layer may have a refractive index between about 2.0 and about 3.0.

BRIEF DESCRIPTION OF THE DRAWINGS

The above and other aspects of certain of the disclosure will be more apparent from the following description taken in conjunction with the accompanying drawings, in which.

DETAILED DESCRIPTION

Figure 1:
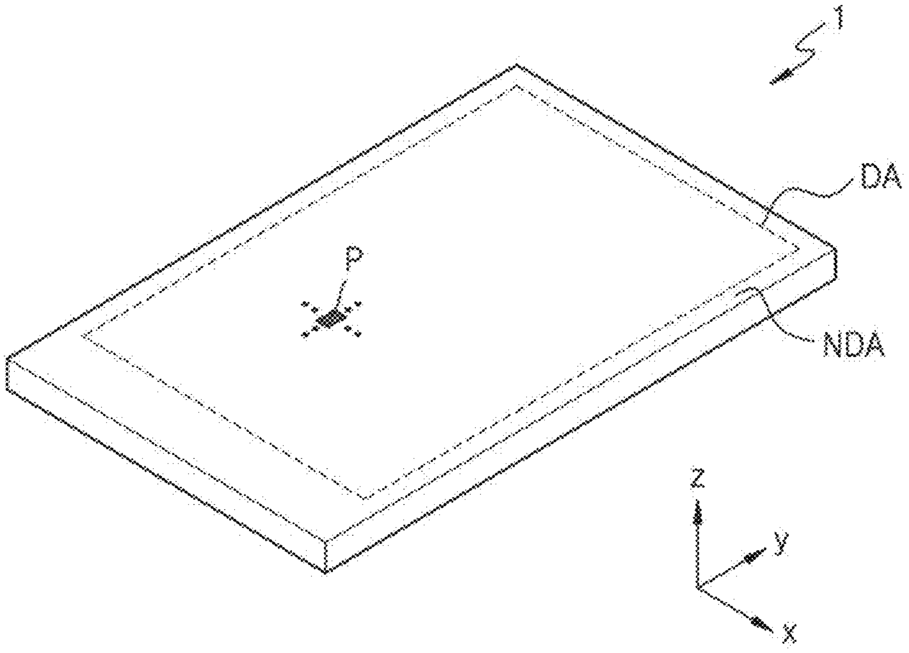
FIG. 1 is a schematic perspective view of a display apparatus according to one or more embodiments.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The use of "can," "may," or "may not" in describing an embodiment corresponds to one or more embodiments of the present disclosure.

A person of ordinary skill in the art would appreciate, in view of the present disclosure in its entirety, that the present disclosure covers all modifications, equivalents, and replacements within the idea and technical scope of the present disclosure, that each of the features of embodiments of the present disclosure may be combined with each other, in part or in whole, and technically various interlocking and operating are possible, and that each embodiment may be implemented independently of each other, or may be implemented together in an association, unless otherwise stated or implied.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or one or more intervening layers, regions, or components may be present. The one or more intervening components may include a switch, a resistor, a capacitor, and/or the like. In describing embodiments, an expression of connection indicates electrical connection unless explicitly described to be direct connection, and "directly connected/directly coupled," or "directly on," refers to one component directly connecting or coupling another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to," may be construed similarly. It will be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expressions "at least one of A and B" and "at least one of A or B" may include A, B, or A and B. As used herein, "or" generally means "and/or," and the term "and/or" includes any and all combinations of one or more of the associated listed items. For example, the expression "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. For example, "substantially" may include a range of +/−5% of a corresponding value. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display apparatus 1 according to one or more embodiments.

Referring to FIG. 1, the display apparatus 1 may include a display area DA that displays an image, and a non-display area NDA that is a peripheral area that does not display an image. In one or more embodiments, the non-display area NDA may entirely surround the display area DA (e.g., in plan view). In other words, it may be understood that a substrate 100 (see FIG. 3) included in the display apparatus 1 has the display area DA and the non-display area NDA.

The display apparatus 1 may include a plurality of pixels P arranged in the display area DA. The display apparatus 1 may provide an image by using light emitted from the plurality of pixels P. Each of the plurality of pixels P may include a display element, such as a light-emitting diode LED shown in FIG. 2. Each pixel P may emit, for example, red, green, blue, or white light through the light-emitting diode LED. Hereinafter, in the present specification, the pixels P refer to sub-pixels that emit light having different colors, and each pixel P may be, for example, a sub-pixel that emits red (R), green (G), or blue (B) light.

The non-display area NDA may be an area where pixels P are not arranged. A driver for providing electrical signals or power to the pixels P, and the like may be arranged in the non-display area NDA. In the non-display area NDA, there may be arranged pads to which various electronic devices, a printed circuit board, etc. may be electrically connected. The pads may be arranged to be apart from each other in the non-display area NDA, and may be electrically connected to a printed circuit board or integrated circuit device.

Although FIG. 1 shows the display apparatus 1 having a quadrangular display area DA, the disclosure is not limited thereto. For example, the shape of the display area DA may be a circle, an ellipse, or a polygon, such as a triangle or pentagon.

Figure 2:
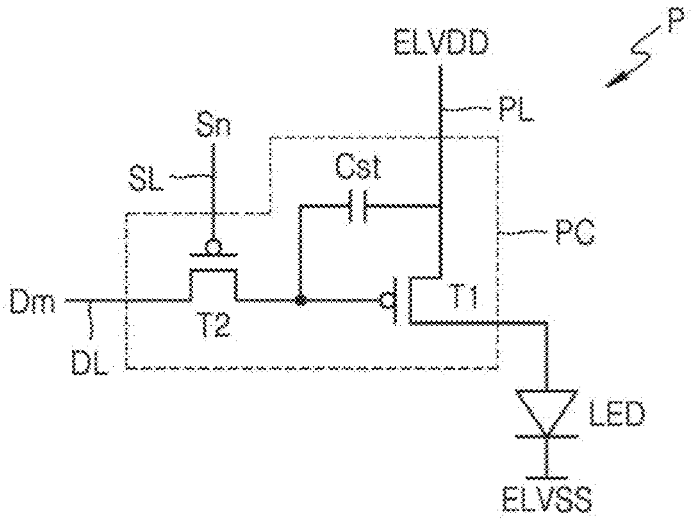
FIG. 2 is an equivalent circuit diagram of one pixel included in a display apparatus according to one or more embodiments.

FIG. 2 is an equivalent circuit diagram of one pixel P included in a display apparatus according to one or more embodiments.

Referring to FIG. 2, the pixel P may include a pixel circuit PC connected to a scan line SL and a data line DL, and a light-emitting diode LED connected to the pixel circuit PC.

The pixel circuit PC may include a driving thin-film transistor T1, a switching thin-film transistor T2, and a storage capacitor Cst.

The switching thin-film transistor T2 may be configured to transmit a data signal Dm input through the data line DL to the driving thin-film transistor T1 according to a scan signal Sn input through the scan line SL.

The storage capacitor Cst may be connected to the switching thin-film transistor T2 and a driving voltage line PL, and may store a voltage difference between a voltage received from the switching thin-film transistor T2 and a first power voltage (or a driving voltage) ELVDD applied to the driving voltage line PL.

The driving thin-film transistor T1 may be connected to the driving voltage line PL and to the storage capacitor Cst, and may be configured to control a driving current flowing to the light-emitting diode LED from the driving voltage line PL according to the voltage stored in the storage capacitor Cst. The light-emitting diode LED may emit light having a certain brightness according to the driving current.

Although FIG. 2 illustrates the case where the pixel circuit PC includes two thin-film transistors and one storage capacitor, the disclosure is not limited thereto. For example, the pixel circuit PC may include three or more thin-film transistors or two or more storage capacitors. The number and circuit design of thin-film transistors and storage capacitors of the pixel circuit PC may be changed in various ways.

In FIG. 2, each of the driving thin-film transistor T1 and the switching thin-film transistor T2 is shown as including a p-channel metal oxide semiconductor field-effect transistor (p-channel MOSFET (PMOS)). However, the disclosure is not limited thereto. In one or more embodiments, one or both of the driving thin-film transistor T1 and the switching thin-film transistor T2 may include an n-channel MOSFET (NMOS). In one or more embodiments, some of the plurality of thin-film transistors included in the pixel circuit PC may include PMOSs, and the remaining ones of the plurality of thin-film transistors may include NMOSs.

Figure 3:
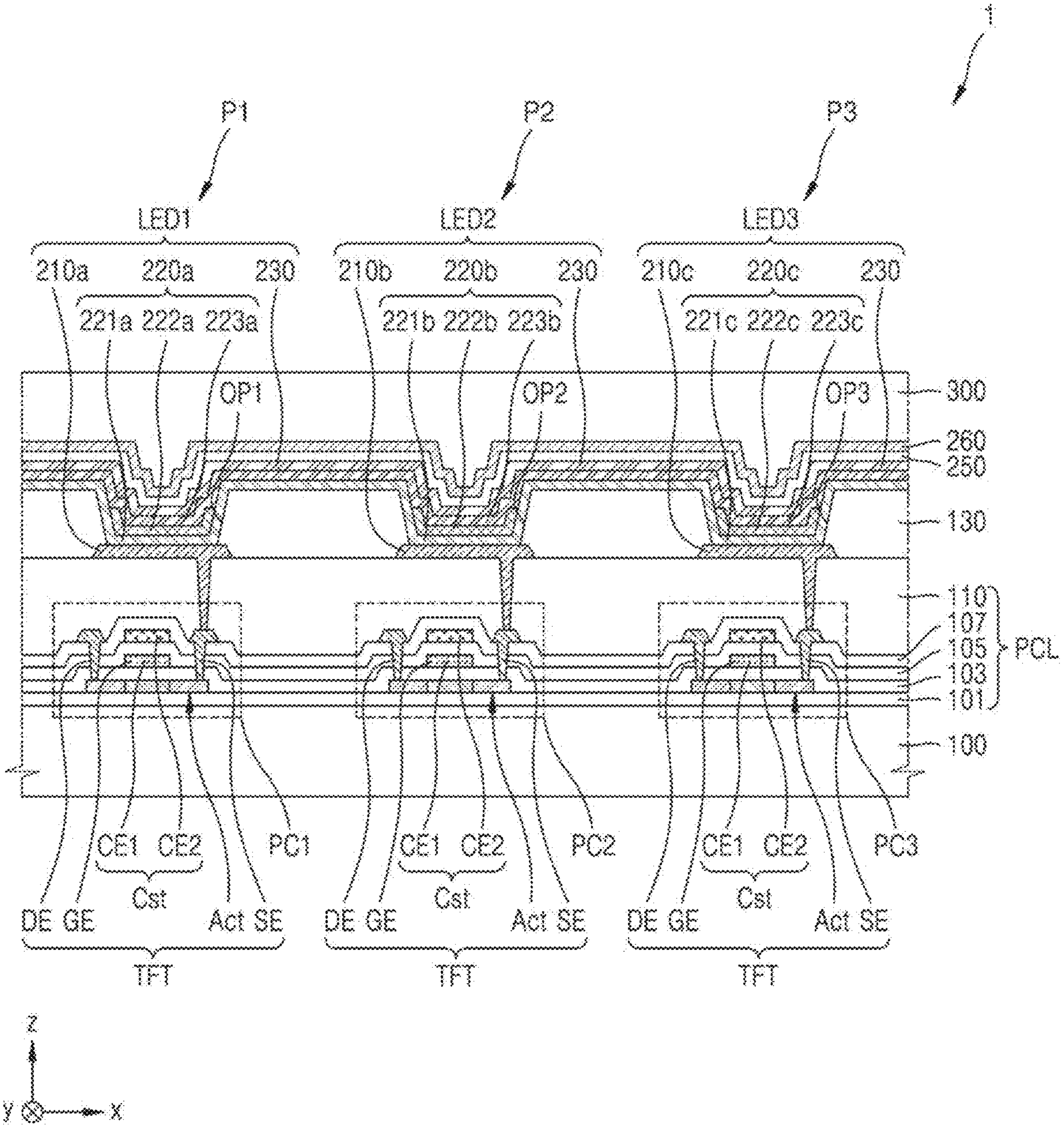
FIG. 3 is a schematic cross-sectional view of a display apparatus according to one or more embodiments.
Figure 4:
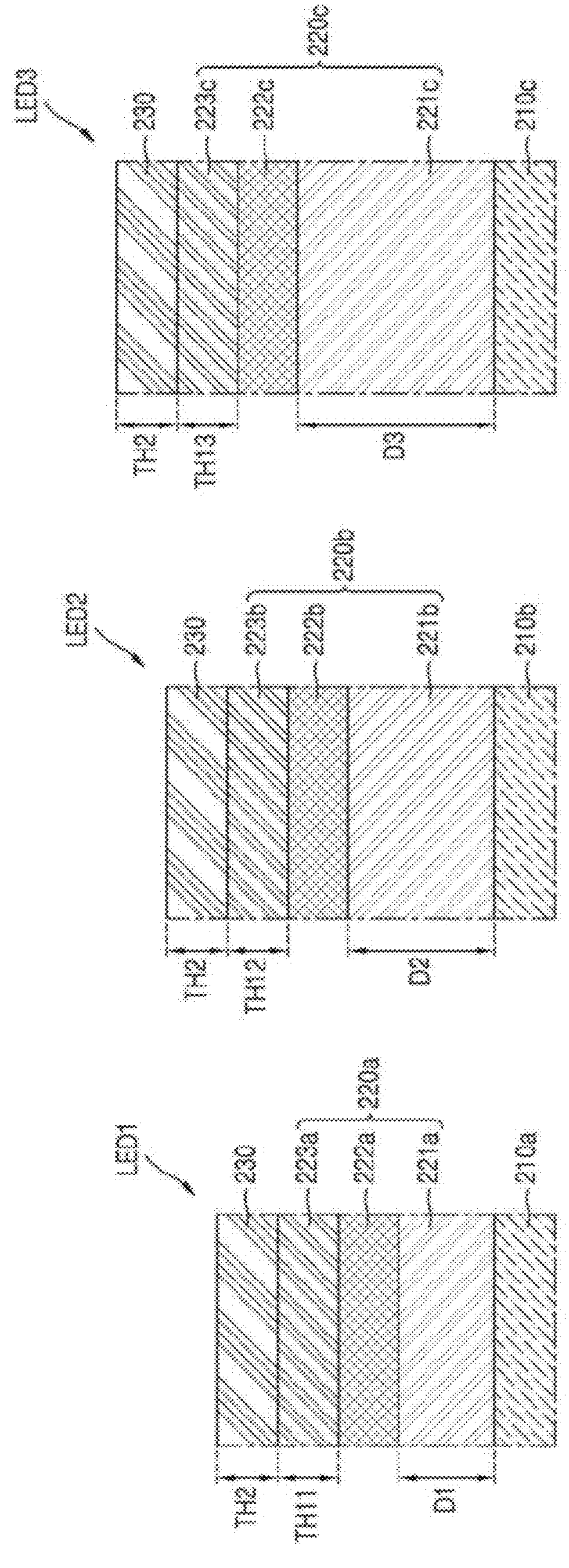
FIG. 4 is an enlarged view schematically showing first to third light-emitting diodes of FIG. 3.

FIG. 3 is a schematic cross-sectional view of a display apparatus 1 according to one or more embodiments. FIG. 4 is an enlarged view schematically showing first to third light-emitting diodes LED1, LED2, and LED3 of FIG. 3.

Referring to FIG. 3, the display apparatus 1 may include a first pixel P1, a second pixel P2, and a third pixel P3 that emit light having different respective wavelengths. The first pixel P1, the second pixel P2, and the third pixel P3 may include the first light-emitting diode LED1, the second light-emitting diode LED2, and the third light-emitting diode LED3, respectively. In one or more embodiments, the first light-emitting diode LED1 may emit light having a blue wavelength, the second light-emitting diode LED2 may emit light having a green wavelength, and the third light-emitting diode LED3 may emit light having a red wavelength.

The display apparatus 1 may include a substrate 100, a pixel circuit layer PCL on the substrate 100, the first to third light-emitting diodes LED1, LED2, and LED3 on the pixel circuit layer PCL, and an encapsulation member 300 on the first to third light-emitting diodes LED1, LED2, and LED3.

The substrate 100 may include glass, metal, or polymer resin. The polymer resin may include, for example, polyethersulfone, polyacrylate, polyetherimide, polyethylene naphthalate, polyethylene terephthalate, polyphenylene sulfide, polyarylate, polyimide, polycarbonate, cellulose acetate propionate, or a mixture thereof. The substrate 100 may have various modifications, such as having a multi-layered structure including two layers including the polymer resin and a barrier layer including an inorganic material (e.g., silicon oxide ($SiO_x$), silicon nitride ($SiN_x$), or silicon oxynitride ($SiO_xN_y$)) located between the two layers.

The pixel circuit layer PCL may include first to third pixel circuits PC1, PC2, and PC3 and insulating layers. Each of the first to third pixel circuits PC1, PC2, and PC3 may include a thin-film transistor and a storage capacitor, as previously described with reference to FIG. 2. As one or more embodiments, FIG. 3 shows a thin-film transistor TFT and a storage capacitor Cst, provided in each of the first to third pixel circuits PC1, PC2, and PC3.

The pixel circuit layer PCL may include a buffer layer 101, a first gate-insulating layer 103, a second gate-insulating layer 105, an interlayer insulating layer 107, a thin-film transistor TFT, and a via-insulating layer 110.

The buffer layer 101 may be located on the substrate 100 to flatten the upper surface of the substrate 100. The buffer layer 101 may function to block impurities, moisture, or external gas from entering the display apparatus 1 from outside. The buffer layer 101 may include an inorganic insulating material, such as silicon oxide ($SiO_x$), silicon nitride ($SiN_x$), or silicon oxynitride ($SiO_xN_y$). The buffer layer 101 may include a single-layered or multi-layered structure including the aforementioned inorganic insulating material.

Each of the first to third pixel circuits PC1, PC2, and PC3 may include at least one thin-film transistor TFT and a storage capacitor Cst. The thin-film transistor TFT may include a semiconductor layer Act, a gate electrode GE, a source electrode SE, and a drain electrode DE.

The semiconductor layer Act may be located on the buffer layer 101. The semiconductor layer Act may include an oxide semiconductor and/or a silicon semiconductor. When the semiconductor layer Act is formed of an oxide semiconductor, the semiconductor layer Act may include oxide of at least one material selected from the group including, for example, indium (In), gallium (Ga), tin (Sn), zirconium (Zr), vanadium (V), hafnium (Hf), cadmium (Cd), germanium (Ge), chromium (Cr), titanium (Ti), or zinc (Zn). For example, the semiconductor layer Act may be an InSnZnO (ITZO) semiconductor layer, an InGaZnO (IGZO) semiconductor layer, or the like. When the semiconductor layer Act is formed of a silicon semiconductor, the semiconductor layer Act may include, for example, amorphous silicon or low temperature poly-silicon (LTPS). A barrier layer that blocks or reduces the infiltration of external air may be further included between the substrate 100 and the buffer layer 101.

The first gate-insulating layer 103 may be located on the buffer layer 101. The first gate-insulating layer 103 may be located on the semiconductor layer Act. The first gate-insulating layer 103 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

The gate electrode GE may be located on the semiconductor layer Act. The first gate-insulating layer 103 may be between the gate electrode GE and the semiconductor layer Act. The gate electrode GE may overlap a channel area of the semiconductor layer Act. The gate electrode GE may include a low-resistance metal material. For example, the gate electrode GE may include a single layer or multi-layer including one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu). The gate electrode GE may be connected to a gate line that applies an electrical signal to the gate electrode GE.

The second gate-insulating layer 105 may be located on the first gate-insulating layer 103. The second gate-insulating layer 105 may cover the gate electrode GE. Similar to the first gate-insulating layer 103, the second gate-insulating layer 105 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

A second capacitor electrode CE2 of the storage capacitor Cst may be located on the second gate-insulating layer 105. In one or more embodiments, the second capacitor electrode CE2 may overlap the gate electrode GE. The second gate-insulating layer 105 may be between the gate electrode GE and the second capacitor electrode CE2. The gate electrode GE and the second capacitor electrode CE2 that overlap each other may form the storage capacitor Cst. That is, the gate electrode GE may function as a first capacitor electrode CE1 of the storage capacitor Cst. As shown in FIG. 3, the storage capacitor Cst and the thin-film transistor TFT may overlap each other, but are not limited thereto. In one or more other embodiments, the storage capacitor Cst and the thin-film transistor TFT may not overlap each other.

The interlayer insulating layer 107 may be located on the second gate-insulating layer 105. The interlayer insulating layer 107 may cover the second capacitor electrode CE2. The interlayer insulating layer 107 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 107 may be a single layer or multi-layer including the aforementioned inorganic insulating material.

The source electrode SE and the drain electrode DE may each be located on the interlayer insulating layer 107. The source electrode SE and the drain electrode DE may be electrically connected to the semiconductor layer Act through contact holes formed in the first gate-insulating layer 103, the second gate-insulating layer 105, and the interlayer insulating layer 107. The source electrode SE and the drain electrode DE may each include a material having good conductivity. At least one of the source electrode SE and the drain electrode DE may include a conductive material including molybdenum (Mo), aluminum (Al), copper (Cu), titanium (Ti), or the like, and may include a multi-layer or single layer including the aforementioned conductive material. In one or more embodiments, at least one of the source electrode SE and the drain electrode DE may have a multi-layered structure including Ti/Al/Ti layers.

The via-insulating layer 110 may be located on the interlayer insulation layer 107. The via-insulating layer 110 may be located on the source electrode SE and the drain electrode DE. The via-insulating layer 110 is shown as a single layer, but is not limited thereto, and may be formed as a multi-layer. The via-insulating layer 110 may be an organic insulating layer including an organic material. The via-insulating layer 110 may include an organic insulating material, such as a general-purpose polymer (e.g., poly (methyl methacrylate) (PMMA) or polystyrene (PS)), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or any blends thereof. The via-insulating layer 110 may flatten the upper surfaces of the first to third pixel circuits PC1, PC2, and PC3, thereby flattening the surfaces where the first to third light-emitting diodes LED1, LED2, and LED3 will be arranged.

The first to third light-emitting diodes LED1, LED2, and LED3 may be organic light-emitting diodes including an organic emission layer.

The first to third light-emitting diodes LED1, LED2, and LED3 may be electrically connected to the first to third pixel circuits PC1, PC2, and PC3, respectively, located between the substrate 100 and the first to third light-emitting diodes LED1, LED2, and LED3 in a direction (e.g., a z direction) perpendicular to the upper surface of the substrate 100.

Each of the first to third light-emitting diodes LED1, LED2, and LED3 may have a stacked structure including a pixel electrode, an intermediate layer, and an opposite electrode. The first light-emitting diode LED1 may include a first pixel electrode 210*a*, a first intermediate layer 220*a*, and an opposite electrode 230. The first pixel electrode 210*a* may be electrically connected to the first pixel circuit PC1. The second light-emitting diode LED2 may include a second pixel electrode 210*b*, a second intermediate layer 220*b*, and the opposite electrode 230. The second pixel electrode 210*b* may be electrically connected to the second pixel circuit PC2. The third light-emitting diode LED3 may include a third pixel electrode 210*c*, a third intermediate layer 220*c*, and the opposite electrode 230. The third pixel electrode 210*c* may be electrically connected to the third pixel circuit PC3.

The first to third pixel electrodes 210*a*, 210*b*, and 210*c* may be located on the via-insulating layer 110. The first to third pixel electrodes 210*a*, 210*b*, and 210*c* may be electrically connected to thin-film transistors TFT provided in the first to third pixel circuits PC1, PC2, and PC3, respectively. For example, the first pixel electrode 210*a* may be electrically connected to the thin-film transistor TFT of the first pixel circuit PC1 through a contact hole in the via-insulating layer 110.

The first to third pixel electrodes 210*a*, 210*b*, and 210*c* may be transmissive electrodes, semi-transmissive electrodes, or reflective electrodes. When the first to third pixel electrodes 210*a*, 210*b*, and 210*c* are transmissive electrodes, the first to third pixel electrodes 210*a*, 210*b*, and 210*c* may each include a transparent conductive material, such as indium tin oxide (ITO), indium zinc oxide (IZO), zinc oxide (ZnO), indium oxide ($In_2O_3$), indium gallium oxide (IGO), or aluminum zinc oxide (AZO). When the first to third pixel electrodes 210*a*, 210*b*, and 210*c* are semi-transmissive electrodes or reflective electrodes, the first to third pixel electrodes 210*a*, 210*b*, and 210*c* may each include a reflective layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound thereof.

The first to third pixel electrodes 210*a*, 210*b*, and 210*c* may each have a single-layered structure including a single layer or a multi-layered structure including a plurality of layers. In one or more embodiments, the first to third pixel electrodes 210*a*, 210*b*, and 210*c* may be reflective electrodes, and may have a stacked structure including at least one reflective layer and at least one transparent conductive layer. For example, the first to third pixel electrodes 210*a*, 210*b*, and 210*c* may each have a triple-layered structure in which a transparent conductive layer including a transparent conductive oxide is located above and below the reflective layer described above. For example, the first to third pixel electrodes 210*a*, 210*b*, and 210*c* may each have a stacked structure including ITO/Ag/ITO layers.

A pixel-defining layer 130 may be located on the via-insulating layer 110. The pixel-defining layer 130 may be located on the first to third pixel electrodes 210*a*, 210*b*, and 210*c* and may include a first pixel opening OP1 exposing a portion of the first pixel electrode 210*a*, a second pixel opening OP2 exposing a portion of the second pixel electrode 210*b*, and a third pixel opening OP3 exposing a portion of the third pixel electrode 210*c*. That is, at least portions of the upper surfaces of the first to third pixel electrodes 210*a*, 210*b*, and 210*c* may be exposed by the first to third pixel openings OP1, OP2, and OP3 defined in the pixel-defining layer 130. The emission area of each pixel may be defined through the first to third pixel openings OP1, OP2, and OP3 that expose at least portions of the first to third pixel electrodes 210*a*, 210*b*, and 210*c*. The pixel-defining layer 130 may reduce or prevent the likelihood of arcs occurring at the edges of the first to third pixel electrodes 210*a*, 210*b*, and 210*c* by increasing the distance between the edge of each of the first to third pixel electrodes 210*a*, 210*b*, and 210*c* and the opposite electrode 230. The pixel-defining layer 130 may include an organic material, such as polyimide or hexamethyldisiloxane (HMDSO).

The opposite electrode 230 may be located on the first to third pixel electrodes 210*a*, 210*b*, and 210*c* to face the first to third pixel electrodes 210*a*, 210*b*, and 210*c*. Unlike the first to third pixel electrodes 210*a*, 210*b*, and 210*c*, which are patterned to be apart from each other, the opposite electrode 230 may be integrally formed as one body on the substrate 100. That is, the opposite electrode 230 may be located across a plurality of pixels located in the display area DA (see FIG. 1).

In one or more embodiments, the opposite electrode 230 may be provided as a light-transmitting electrode. The light-transmitting electrode may mean that the opposite electrode 230 is provided as a transparent or translucent electrode. In one or more embodiments, the display apparatus 1 may be a top-emitting display apparatus in which light emitted from first to third emission layers 222*a*, 222*b*, and 222*c* passes through the opposite electrode 230, and is emitted to the outside.

The opposite electrode 230 may include, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), lithium fluoride (LiF), or an alloy thereof. The opposite electrode 230 may include a single layer or a multi-layer.

As the first to third pixel electrodes 210*a*, 210*b*, and 210*c* are provided as reflective electrodes, and the opposite electrode 230 is provided as a light-transmitting electrode, the first to third light-emitting diodes LED1, LED2, and LED3 may form a microcavity.

The first to third intermediate layers 220*a*, 220*b*, and 220*c* may be located on the first to third pixel electrodes 210*a*, 210*b*, and 210*c*, respectively. The first intermediate layer 220*a* may be between the first pixel electrode 210*a* and the opposite electrode 230. The second intermediate layer 220*b* may be between the second pixel electrode 210*b* and the opposite electrode 230. The third intermediate layer 220*c* may be between the third pixel electrode 210*c* and the opposite electrode 230. The first to third intermediate layers 220*a*, 220*b*, and 220*c* may be located in the first to third pixel openings OP1, OP2, and OP3 of the pixel-defining layer 130, respectively.

The first intermediate layer 220*a* may include a first emission layer 222*a* that emits light having a first color, a 1st-1 functional layer 221*a* located below the first emission layer 222*a*, and a 2nd-1 functional layer 223*a* located above the first emission layer 222*a*. The second intermediate layer 220*b* may include a second emission layer 222*b* that emits light having a second color, a 1 st-2 functional layer 221*b* located below the second emission layer 222*b*, and a 2nd-2 functional layer 223*b* located above the second emission layer 222*b*. The third intermediate layer 220*c* may include a third emission layer 222*c* that emits light having a third color, a 1st-3 functional layer 221*c* located below the third emission layer 222*c*, and a 2nd-3 functional layer 223*c* located above the third emission layer 222*c*.

In one or more embodiments, the first to third emission layers 222*a*, 222*b*, and 222*c* may emit light having different wavelengths. For example, the first emission layer 222*a* may emit light having a blue wavelength, the second emission layer 222*b* may emit light having a green wavelength, and the third emission layer 222*c* may emit light having a red wavelength. The first to third emission layers 222*a*, 222*b*, and 222*c* may be patterned and provided for each pixel.

The first to third emission layers 222*a*, 222*b*, and 222*c* may each include a host and a dopant. For example, the dopant may include at least one of a phosphorescent dopant and a fluorescent dopant.

The 1 st-1 functional layer 221*a* may be between the first pixel electrode 210*a* and the first emission layer 222*a*. The 1st-2 functional layer 221*b* may be between the second pixel electrode 210*b* and the second emission layer 222*b*. The 1st-3 functional layer 221*c* may be between the third pixel electrode 210*c* and the third emission layer 222*c*. The 1st-1 functional layer 221*a*, the 1st-2 functional layer 221*b*, and the 1 st-3 functional layer 221*c* may be integrally formed as one body across a plurality of pixels on the substrate 100. However, in this case, some layers (e.g., emission auxiliary layer) included in the 1st-1 functional layer 221*a,* 1 st-2 functional layer 221*b*, and 1 st-3 functional layer 221*c* may be patterned and provided for each pixel. The 1 st-1 functional layer 221*a*, the 1 st-2 functional layer 221*b*, and the 1 st-3 functional layer 221*c* may be referred to as lower functional layers of the first light-emitting diode LED1, the second light-emitting diode LED2, and the third light-emitting diode LED2, respectively.

The 1st-1 functional layer 221*a*, the 1st-2 functional layer 221*b*, and the 1st-3 functional layer 221*c* may be defined as hole transport regions that transport holes. Each of the hole transport regions may have a single-layered structure including a single layer including a single material, may have a single-layered structure including a single layer including a plurality of different materials, or may have a multi-layered structure including a plurality of layers including a plurality of different materials.

In one or more embodiments, the hole transport region may include at least one layer selected from a hole injection layer (HIL), a hole transport layer (HTL), an emission auxiliary layer, or an electron-blocking layer (EBL). In one or more embodiments, the thicknesses of the HIL, the HTL, the emission auxiliary layer, and the EBL included in each of the 1 st-1 functional layer 221*a*, the 1 st-2 functional layer 221*b*, and the 1 st-3 functional layer 221*c* may be provided independently of each other.

For example, the hole transport region may have a single-layered structure including a single layer including a plurality of different materials, or may have a multi-layered structure including HIL/HTL, HIL/HTL/emission auxiliary layer, HIL/emission auxiliary layer, HTL/emission auxiliary layer, or HIL/HTL/EBL, which are sequentially stacked on a pixel electrode (e.g., one of the first to third pixel electrodes 210*a*, 210*b*, and 210*c*). However, the disclosure is not limited thereto.

The emission auxiliary layer increases light emission efficiency by compensating for an optical resonance distance according to the wavelength of light emitted from an emission layer, and the EBL reduces or prevents electron injection from an electron transport region. The emission auxiliary layer and the EBL may include materials as described above. The thickness of the emission auxiliary layer may be independently provided for each pixel.

The 2nd-1 functional layer 223*a* may be between the first emission layer 222*a* and the opposite electrode 230. The 2nd-2 functional layer 223*b* may be between the second emission layer 222*b* and the opposite electrode 230. The 2nd-3 functional layer 223*c* may be between the third emission layer 222*c* and the opposite electrode 230. The 2nd-1 functional layer 223*a*, the 2nd-2 functional layer 223*b*, and the 2nd-3 functional layer 223*c* may be integrally formed as one body across a plurality of pixels on the substrate 100. The 2nd-1 functional layer 223*a*, the 2nd-2 functional layer 223*b*, and the 2nd-3 functional layer 223*c* may be referred to as upper functional layers of the first light-emitting diode LED1, the second light-emitting diode LED2, and the third light-emitting diode LED2, respectively.

The 2nd-1 functional layer 223*a*, the 2nd-2 functional layer 223*b*, and the 2nd-3 functional layer 223*c* may be defined as electron transport regions that transport electrons.

Each of the electron transport region may have a single-layered structure including a single layer including a single material, may have a single-layered structure including a single layer including a plurality of different materials, or may have) a multi-layered structure including a plurality of layers including a plurality of different materials.

The electron transport region may include, but is not limited to, at least one layer selected from a buffer layer, a hole-blocking layer, an electron control layer, an electron transport layer (ETL), or an electron injection layer (EIL).

For example, the electron transport region may have a structure including ETL/EIL, hole-blocking layer/ETL/EIL, electron control layer/ETL/EIL, or buffer layer/ETL/EIL, which are sequentially stacked on an emission layer (e.g., one of the first to third emission layers 222*a*, 222*b*, and 222*c*). However, the disclosure is not limited thereto.

The thicknesses of the buffer layer, the hole-blocking layer, the electron control layer, the ETL, and the EIL included in each of the 2nd-1 functional layer 223*a*, the 2nd-2 functional layer 223*b*, and the 2nd-3 functional layer 223*c* may be provided independently of each other.

In one or more embodiments, the display apparatus 1 may further include a capping layer 250 located on the opposite electrode 230. The capping layer 250 may increase the reflectivity of the opposite electrode 230, thereby improving the resonance efficiency of a resonance structure formed between the first to third pixel electrodes 210*a*, 210*b*, and 210*c* and the opposite electrode 230. As the resonance efficiency of the resonance structure improves, the light extraction efficiency of the display apparatus 1 may increase.

In one or more embodiments, the display apparatus 1 may further include a first optical functional layer 260 located on the first to third light-emitting diodes LED1, LED2, and LED3. The first optical functional layer 260 may be located on the opposite electrode 230. In one or more embodiments, the first optical functional layer 260 may be located on the capping layer 250. In one or more embodiments, the first optical functional layer 260 is shown between the capping layer 250 and an encapsulation member 300, but the disclosure is not limited thereto. The location where the first optical functional layer 260 is located may vary depending on embodiments.

The first optical functional layer 260 may have an uneven surface or an irregular surface. In the present specification, the fact that the first optical functional layer 260 has an uneven surface (or irregular surface) may mean that the surface roughness of the first optical functional layer 260 is relatively greater than the surface roughness of a component in contact with or adjacent to the first optical functional layer 260. For example, the surface roughness of the first optical functional layer 260 may be greater than the surface roughness of the capping layer 250. For example, the surface roughness of the first optical functional layer 260 may be greater than the surface roughness of the opposite electrode 230. In one or more embodiments, the first optical functional layer 260 may include an organic material.

The encapsulation member 300 may be located on the first to third light-emitting diodes LED1, LED2, and LED3 to seal the first to third light-emitting diodes LED1, LED2, and LED3. The encapsulation member 300 may be located on the capping layer 250 and the first optical functional layer 260. The encapsulation member 300 may include at least one inorganic encapsulation layer and at least one organic encapsulation layer. In one or more embodiments, the encapsulation member 300 may include a first inorganic encapsulation layer, an organic encapsulation layer, and a second inorganic encapsulation layer that are sequentially stacked.

The first inorganic encapsulation layer and the second inorganic encapsulation layer may each include one or more inorganic insulating materials. The inorganic insulating material may include aluminum oxide, tantalum oxide, hafnium oxide, zinc oxide, silicon oxide, silicon nitride, or/and silicon oxynitride. The organic encapsulation layer may include a polymer-based material. The polymer-based material may include acrylic resin, epoxy resin, polyimide, polyethylene, or the like. The acrylic resin may include, for example, polymethyl methacrylate, polyacrylic acid, or the like.

Referring to FIG. 4, the distance between the pixel electrode and the emission layer of each of the first to third light-emitting diodes LED1, LED2, and LED3 may vary. That is, a distance D1 between the first pixel electrode 210*a* and the first emission layer 222*a*, a distance D2 between the second pixel electrode 210*b* and the second emission layer 222*b*, and a distance D3 between the third pixel electrode 210*c* and the third emission layer 222*c* may be different from each other. For example, the distance D1 between the first pixel electrode 210*a* and the first emission layer 222*a* may be between about 800 Å and about 1,500 Å. For example, the distance D2 between the second pixel electrode 210*b* and the second emission layer 222*b* may be between about 1,200 Å and about 2,000 Å. For example, the distance D3 between the third pixel electrode 210*c* and the third emission layer 222*c* may be between about 1,800 Å and about 2,500 Å.

A thickness TH11 of the 2nd-1 functional layer 223*a* may range, for example, from about 100 Å to about 400 Å. The thickness of the ETL included in the 2nd-1 functional layer 223*a* may range, for example, from about 100 Å to about 310 Å. The thickness of the ETL included in the 2nd-1 functional layer 223*a* may range, for example, from about 100 Å to about 250 Å. When the thickness TH11 of the 2nd-1 functional layer 223*a* exceeds about 400 Å, the lifespan of the first to third light-emitting diodes LED1, LED2, and LED3 may be reduced.

The thicknesses of the upper functional layers of the first to third light-emitting diodes LED1, LED2, and LED3 may be substantially the same. In one or more embodiments, the thickness TH11 of the 2nd-1 functional layer 223*a* of the first light-emitting diode LED1, a thickness TH12 of the 2nd-2 functional layer 223*b* of the second light-emitting diode LED2, and a thickness TH13 of the 2nd-3 functional layer 223*c* of the third light-emitting diode LED3 may be substantially the same. The thickness TH11 of the 2nd-1 functional layer 223*a* may refer to the distance between the first emission layer 222*a* and the opposite electrode 230, the thickness TH12 of the 2nd-2 functional layer 223*b* may refer to the distance between the second emission layer 222*b* and the opposite electrode 230, and the thickness TH13 of the 2nd-3 functional layer 223*c* may refer to the distance between the third emission layer 222*c* and the opposite electrode 230. In one or more embodiments, the thicknesses of the ETLs included in the 2nd-1 functional layer 223*a*, 2nd-2 functional layer 223*b*, and 2nd-3 functional layer 223*c* may be substantially the same.

Because the thickness of the ETL in each of the first to third light-emitting diodes LED1, LED2, and LED3 is about 100 Å to about 310 Å, the distance between each of the first to third emission layers 222*a*, 222*b*, and 222*c* and the opposite electrode 230 may be relatively reduced to increase surface plasmon polariton (SPP). When the SPP increases, excess exciton energy may decrease, thereby increasing the lifespan of the light-emitting diode. Therefore, when the thickness of the ETL is about 100 Å to about 310 Å, the lifespan of the first to third light-emitting diodes LED1, LED2, and LED3 may effectively increase. When the thickness of the ETL is less than about 100 Å, the ETL may not function as an electron transport layer. When the thickness of the ETL exceeds about 310 Å, the SPP may decrease, and the lifespan of the first to third light-emitting diodes LED1, LED2, and LED3 may decrease.

A thickness TH2 of the opposite electrode 230 may range from about 150 Å to about 350 Å. When the thickness TH2 of the opposite electrode 230 is about 150 Å or more, the lifespan of the first to third light-emitting diodes LED1, LED2, and LED3 may effectively increase. When the thickness TH2 of the opposite electrode 230 exceeds 350 Å, the light extraction efficiency of the first to third light-emitting diodes LED1, LED2, and LED3 may decrease.

$$k_{spp} = \frac{\omega}{c}\sqrt{\frac{\varepsilon_d \varepsilon_m}{\varepsilon_d + \varepsilon_m}} \qquad \text{Equation 1}$$

c=speed of light, ω=angular frequency of light, εd=dielectric constant of organic material, and εm=dielectric constant of metallic material According to Equation 1, as the dielectric constant of the organic material or the dielectric constant of the metallic material increases, the value of an SPP constant ($k_{spp}$) increases. As the refractive index of an upper functional layer adjacent to the opposite electrode 230 (e.g., the 2nd-1 functional layer 223*a*, the 2nd-2 functional layer 223*b*, or the 2nd-3 functional layer 223*c*) and/or the capping layer 250 increases, the dielectric constant of the upper functional layer and/or capping layer 250 may increase, and accordingly, the SPP constant value may increase.

The refractive index of each of the 2nd-1 functional layer 223*a*, the 2nd-2 functional layer 223*b*, and the 2nd-3 functional layer 223*c* may range, for example, from about 2.0 to about 3.0. The refractive index of each of the 2nd-1 functional layer 223*a*, the 2nd-2 functional layer 223*b*, and the 2nd-3 functional layer 223*c* may range, for example, from about 2.3 to about 3.0. When the refractive index of each of the 2nd-1 functional layer 223*a*, the 2nd-2 functional layer 223*b*, and the 2nd-3 functional layer 223*c* satisfies the above range, the lifespan of the first to third light-emitting diodes LED1, LED2, and LED3 may effectively increase. When the refractive index of each of the 2nd-1 functional layer 223*a*, the 2nd-2 functional layer 223*b*, and the 2nd-3 functional layer 223*c* is less than 2.0, the SPP may be relatively reduced, and accordingly, the lifespan of the first to third light-emitting diodes LED1, LED2, and LED3 may decrease.

The refractive index of the ETL included in each of the 2nd-1 functional layer 223*a*, the 2nd-2 functional layer 223*b*, and the 2nd-3 functional layer 223*c* may range, for example, from about 2.0 to about 3.0. The refractive index of the ETL included in each of the 2nd-1 functional layer 223*a*, the 2nd-2 functional layer 223*b*, and the 2nd-3 functional layer 223*c* may range, for example, from about 2.3 to about 3.0.

The refractive index of the capping layer 250 may range, for example, from about 2.3 to about 3.0. For example, the refractive index of the capping layer 250 may range from about 2.5 to about 3.0. When the refractive index of the capping layer 250 satisfies the above range, the lifespan of the first to third light-emitting diodes LED1, LED2, and LED3 may effectively increase. When the refractive index of the capping layer 250 is less than about 2.3, the lifespan of the first to third light-emitting diodes LED1, LED2, and LED3 may decrease as the SPP relatively decreases.

In one or more embodiments, in order to prevent or reduce the lowering of the light extraction efficiency of the display apparatus 1 as the SPP is relatively increased, the display apparatus 1 may further include the first optical functional layer 260 (see FIG. 3) located on the first to third light-emitting diodes LED1, LED2, and LED3. Because the first optical functional layer 260 includes an uneven surface (or irregular surface), the light extraction efficiency of the display apparatus 1 may be increased.

Figure 5:
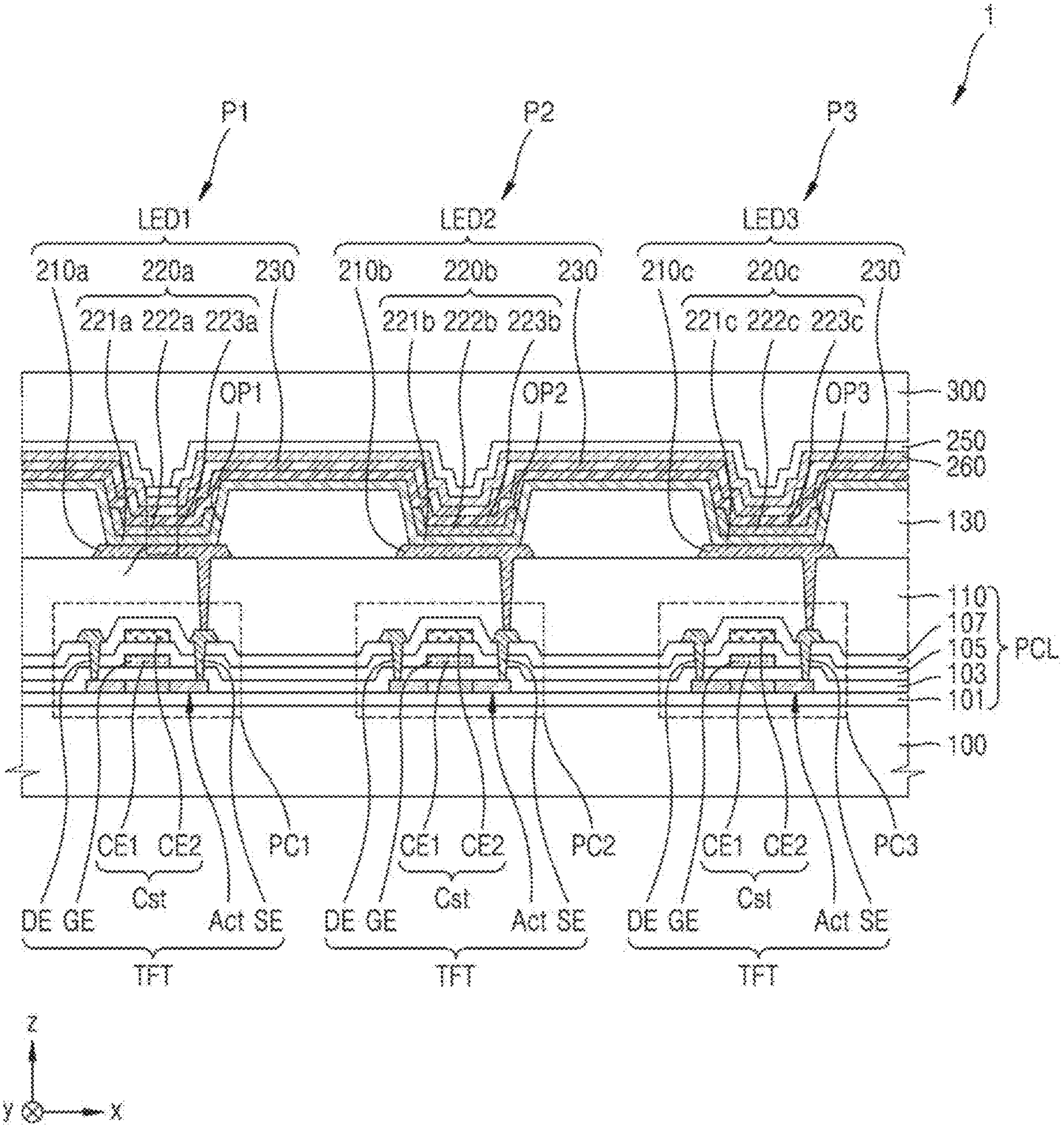
FIG. 5 is a schematic cross-sectional view of a display apparatus according to one or more embodiments.
Figure 6:
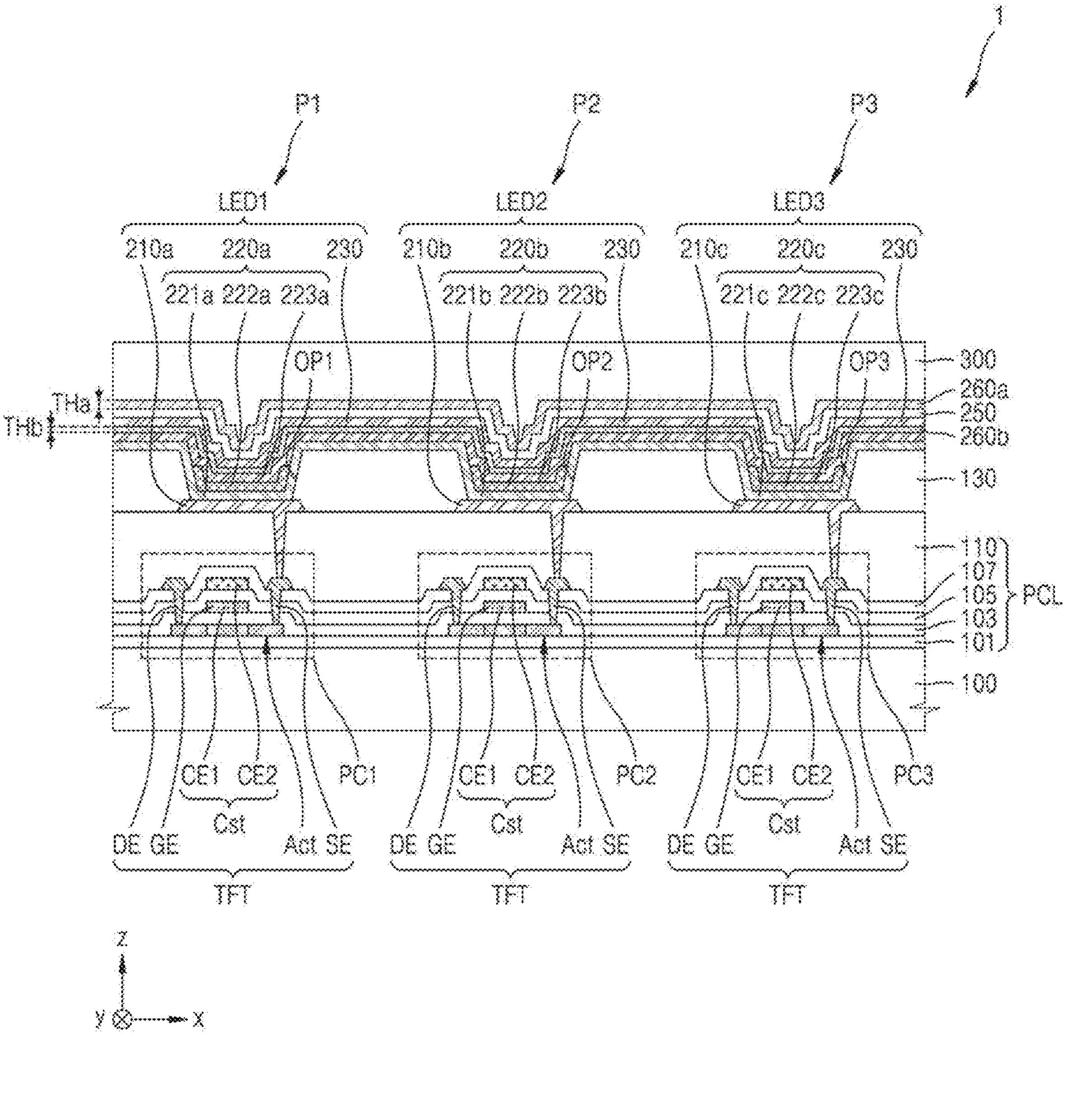
FIG. 6 is a schematic cross-sectional view of a display apparatus according to one or more embodiments.

Hereinafter, the one or more embodiments corresponding to FIG. 5 and the one or more embodiments corresponding to FIG. 6 are modified embodiments of the embodiments described with reference to FIGS. 3 and 4, and thus, redundant descriptions will be omitted and descriptions will focus on the changed content.

FIG. 5 is a schematic cross-sectional view of a display apparatus 1 according to one or more embodiments.

Referring to FIG. 5, the first optical functional layer 260 may be located on the opposite electrode 230. In one or more embodiments, the first optical functional layer 260 may be located below the capping layer 250. In one or more embodiments, the first optical functional layer 260 may be between the opposite electrode 230 and the capping layer 250.

Figure 7:
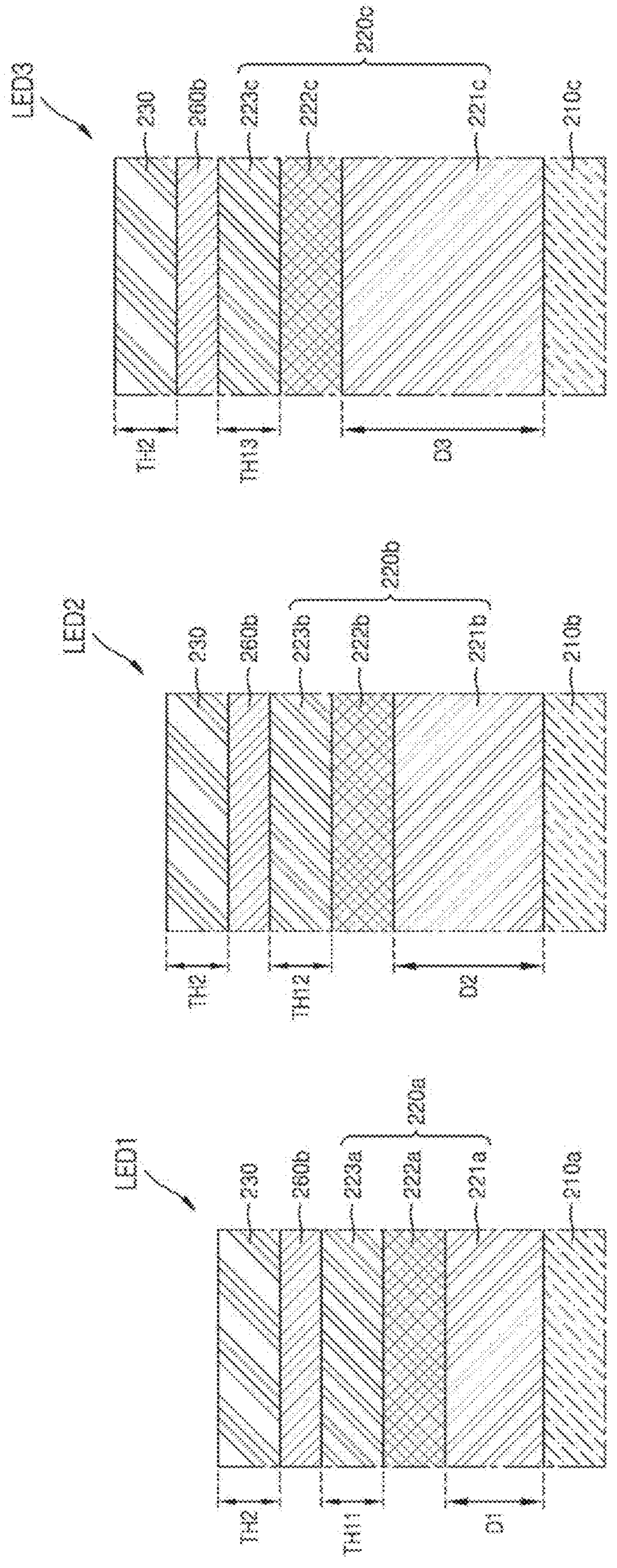
FIG. 7 is an enlarged view schematically showing first to third light-emitting diodes of FIG. 6, according to one or more embodiments.

FIG. 6 is a schematic cross-sectional view of a display apparatus 1 according to one or more embodiments. FIG. 7 is an enlarged view schematically showing first to third light-emitting diodes LED1, LED2, and LED3 of FIG. 6, according to one or more embodiments.

Referring to FIGS. 6 and 7, the display apparatus 1 may further include a first optical functional layer 260*a* located on the first to third light-emitting diodes LED1, LED2, and LED3, and a second optical functional layer 260*b* provided in the first to third light-emitting diodes LED1, LED2, and LED3.

In one or more embodiments, the first optical functional layer 260*a* is shown on the capping layer 250, but the disclosure is not limited thereto. For example, the first optical functional layer 260*a* may be located below the capping layer 250 and between the opposite electrode 230 and the capping layer 250, as shown in FIG. 5.

The first optical functional layer 260*a* may have an uneven surface (or irregular surface). In the present specification, the fact that the first optical functional layer 260*a* has an uneven surface (or irregular surface) may mean that the surface roughness of the first optical functional layer 260*a* is relatively greater than the surface roughness of a component in contact with or adjacent to the first optical functional layer 260*a*. For example, the surface roughness of the first optical functional layer 260*a* may be greater than the surface roughness of the capping layer 250. For example, the surface roughness of the first optical functional layer 260*a* may be greater than the surface roughness of the opposite electrode 230. In one or more embodiments, the first optical functional layer 260*a* may include an organic material.

Each of the first to third light-emitting diodes LED1, LED2, and LED3 may include a second optical functional layer 260*b* between an upper functional layer (e.g., a 2nd-1 functional layer 223*a*, a 2nd-2 functional layer 223*b*, or a 2nd-3 functional layer 223*c*) and the second optical functional layer 260*b*.

The second optical functional layer 260*b* may have an uneven surface or an irregular surface. In the present specification, the fact that the second optical functional layer 260*b* has an uneven surface (or irregular surface) may mean that the surface roughness of the second optical functional layer 260*b* is relatively greater than the surface roughness of a component in contact with or adjacent to the second optical functional layer 260*b*. For example, the surface roughness of the second optical functional layer 260*b* may be greater than the surface roughness of the first to third emission layers 223*a*, 223*b*, and 223*c*. For example, the surface roughness of the second optical functional layer 260*b* may be greater than the surface roughness of the capping layer 250. For example, the surface roughness of the second optical functional layer 260*b* may be greater than the surface roughness of the opposite electrode 230. In one or more embodiments, the second optical functional layer 260*b* may include an organic material.

The first optical functional layer 260*a* may be located above the opposite electrode 230, and the second optical functional layer 260*b* may be located below the opposite electrode 230.

Because the second optical functional layer 260*b* is provided in the first to third light-emitting diodes LED1, LED2, and LED3, when the thickness of the second optical functional layer 260*b* increases excessively, light extraction efficiency may be reduced. Accordingly, a thickness THb of the second optical functional layer 260*b* may be formed to be smaller than a thickness THa of the first optical functional layer 260*a*. That is, the thickness THa of the first optical functional layer 260*a* may be greater than the thickness THb of the second optical functional layer 260*b*. Because the second optical functional layer 260*b* is formed relatively thin, the first optical functional layer 260*a* having an uneven surface (or an irregular surface) may be additionally located on the first to third light-emitting diodes LED1, LED2, and LED3 to more effectively improve light extraction efficiency.

Figure 8:
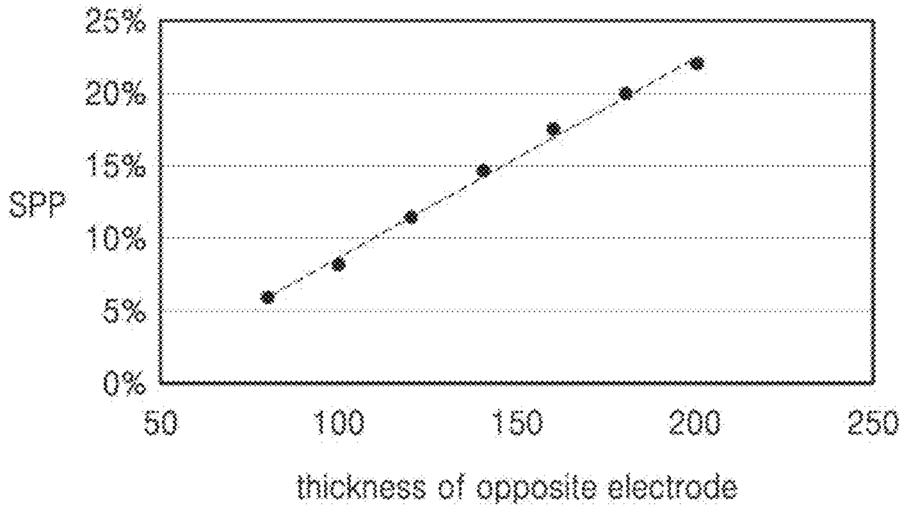
FIG. 8 is a graph showing the results of surface plasmon polariton (SPP) simulation according to a thickness of an opposite electrode.

FIG. 8 is a graph showing the results of surface plasmon polariton (SPP) simulation according to the thickness of an opposite electrode. The opposite electrode includes AgMg.

Referring to FIG. 8, it may be seen that the SPP increases as the thickness of the opposite electrode increases. For example, when the opposite electrode including AgMg is about 150 Å or more, it may be seen that the SPP is about 15% or more. When the SPP increases, the lifespan of the light-emitting diode may be increased by reducing excess exciton energy.

Figure 9:
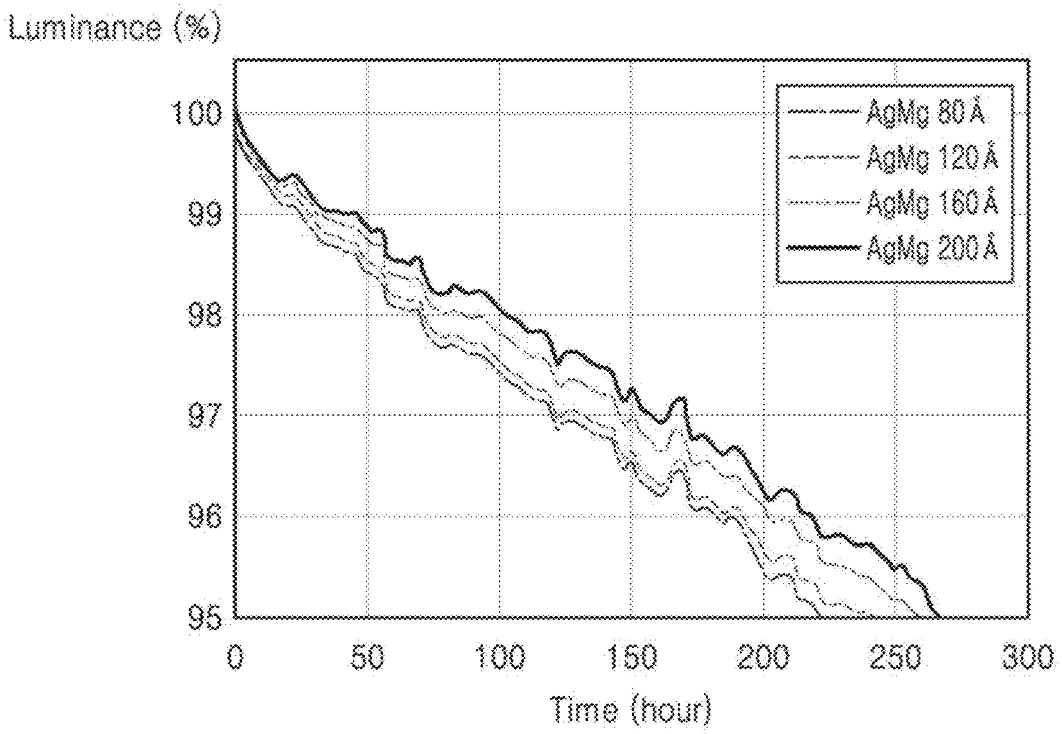
FIG. 9 is a graph obtained by measuring luminance over time in embodiments in which opposite electrodes have different thicknesses.

FIG. 9 is a graph obtained by measuring luminance over time in embodiments in which opposite electrodes have different thicknesses.

For example, FIG. 9 shows a luminance over time for embodiments in which the opposite electrodes include AgMg and respectively have thicknesses of 80 Å, 120 Å, 160 Å, and 200 Å.

Referring to FIG. 9, it may be seen that as the thickness of the opposite electrode increases, the rate of decrease in luminance over time decreases. In other words, as the thickness of the opposite electrode increases, the lifespan of the light-emitting diode increases. In embodiments in which the thickness of the opposite electrode is about 150 Å or more, the time for the luminance to reach 95% of the initial luminance is about 250 hours or more, whereas in embodiments in which the thickness of the opposite electrode is less than about 150 Å, the time for the luminance to reach 95% of the initial luminance is less than about 250 hours. When the thickness of the opposite electrode is about 150 Å or more, it may be seen that the lifespan of the light-emitting diode is effectively increased because the rate of decrease in luminance over time is low.

Figure 10:
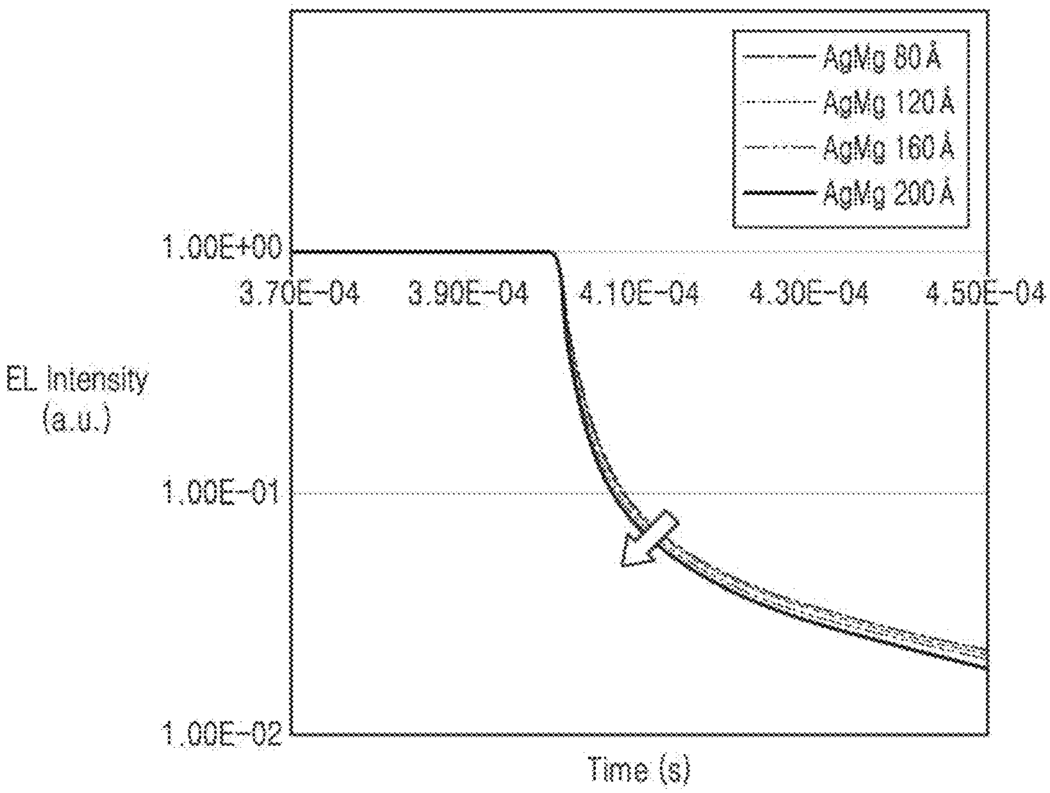
FIG. 10 is a graph obtained by measuring transient electroluminescence (TEL) over time in embodiments in which opposite electrodes have different thicknesses.

FIG. 10 is a graph obtained by measuring transient electroluminescence (TEL) over time in embodiments in which opposite electrodes have different thicknesses. For example, FIG. 10 shows transient electroluminescence (TEL) over time for embodiments in which the opposite electrodes include AgMg and respectively have thicknesses of 80 Å, 120 Å, 160 Å, and 200 Å.

Referring to FIG. 10, as the thickness of the opposite electrode increases, the slope at a falling edge, where the intensity of electroluminescence (EL) decreases over time, increases. In other words, as the thickness of the opposite electrode increases, light is emitted for the time for which an excited triplet state is relatively short, and the excited triplet state returns to a ground state, thereby reducing deterioration of the light-emitting diode. In embodiments in which the thickness of the opposite electrode is about 150 Å or more, the time for which the triplet state is maintained is shorter than that in embodiments in which the thickness of the opposite electrode is less than about 150 Å, thereby reducing deterioration of the light-emitting diode and increasing the lifespan of the light-emitting diode.

According to embodiments of the disclosure, a light-emitting diode having an effectively extended lifespan and a display apparatus including the light-emitting diode may be implemented. Obviously, the scope of the disclosure is not limited by these effects.

It should be understood that embodiments described herein should be considered in a descriptive sense only and not for purposes of limitation. Descriptions of aspects within each embodiment should typically be considered as available for other similar aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:

a substrate;

a pixel electrode above the substrate;

an opposite electrode above the pixel electrode, and having a thickness between about 150 Å and about 350 Å;

an emission layer between the pixel electrode and the opposite electrode;

a first functional layer between the pixel electrode and the emission layer;

a second functional layer between the emission layer and the opposite electrode, and having a thickness between about 100 Å and about 400 Å; and a first optical functional layer above the opposite electrode, and having a rough surface.

2. The display apparatus of claim 1, wherein the second functional layer comprises an electron transport layer having a thickness between about 100 Å and about 310 Å.

3. The display apparatus of claim 1, wherein the second functional layer has a refractive index between about 2.0 and about 3.0.

4. The display apparatus of claim 1, further comprising a capping layer above the opposite electrode.

5. The display apparatus of claim 4, wherein the capping layer has a refractive index between about 2.3 and about 3.0.

6. The display apparatus of claim 1, further comprising a second optical functional layer between the second functional layer and the opposite electrode, and having an uneven surface.

7. The display apparatus of claim 6, wherein a thickness of the first optical functional layer is greater than a thickness of the second optical functional layer.

8. The display apparatus of claim 1, wherein the emission layer is configured to emit blue light, and wherein a distance between the pixel electrode and the emission layer is between about 800 Å and about 1,500 Å.

9. The display apparatus of claim 1, wherein the emission layer is configured to emit green light, and wherein a distance between the pixel electrode and the emission layer is between about 1,200 Å and about 2,000 Å.

10. The display apparatus of claim 1, wherein the emission layer is configured to emit red light, and wherein a distance between the pixel electrode and the emission layer is between about 1,800 Å and about 2,500 Å.

11. The display apparatus of claim 1, wherein the pixel electrode comprises a reflective electrode, and wherein the opposite electrode comprises a light-transmitting electrode.

12. A display apparatus comprising:

a substrate;

a pixel electrode above the substrate;

an opposite electrode above the pixel electrode and having a thickness between about 150 Å and about 350 Å;

an emission layer between the pixel electrode and the opposite electrode;

a first functional layer between the pixel electrode and the emission layer; and a second functional layer between the emission layer and the opposite electrode and having a refractive index between about 2.0 and about 3.0.

13. The display apparatus of claim 12, further comprising a capping layer above the opposite electrode.

14. The display apparatus of claim 13, wherein the capping layer has a refractive index between about 2.3 and about 3.0.

15. The display apparatus of claim 12, further comprising a first optical functional layer above the opposite electrode, and having an uneven surface.

16. The display apparatus of claim 15, further comprising a second optical functional layer between the second functional layer and the opposite electrode, and having an uneven surface.

17. The display apparatus of claim 16, wherein a thickness of the first optical functional layer is greater than a thickness of the second optical functional layer.

18. A light-emitting diode comprising:

a pixel electrode;

an opposite electrode above the pixel electrode, and having a thickness between about 150 Å and about 350 Å;

an emission layer between the pixel electrode and the opposite electrode;

a first functional layer between the pixel electrode and the emission layer; and a second functional layer between the emission layer and the opposite electrode, having a refractive index between about 2.0 and about 3.0, and having a thickness between about 100 Å and about 400 Å.

* * * * *